United States Patent
Hoyt

(10) Patent No.: US 11,894,708 B2
(45) Date of Patent: Feb. 6, 2024

(54) METHOD AND APPARATUS FOR CHARGING A BATTERY BASED ON A WEAR FACTOR CALCULATED FROM USAGE STATISTICS AND USAGE PARAMETERS OF THE BATTERY

(71) Applicant: Apple Inc., Cupertino, CA (US)

(72) Inventor: Robert J. Hoyt, San Jose, CA (US)

(73) Assignee: APPLE INC., Cupertino, CA (US)

( * ) Notice: Subject to any disclaimer, the term of this patent is extended or adjusted under 35 U.S.C. 154(b) by 379 days.

(21) Appl. No.: 16/987,156

(22) Filed: Aug. 6, 2020

(65) Prior Publication Data

US 2022/0045534 A1  Feb. 10, 2022

(51) Int. Cl.
  *H02J 7/00* (2006.01)
  *G01R 31/392* (2019.01)
  *H01M 10/44* (2006.01)

(52) U.S. Cl.
  CPC ............ *H02J 7/005* (2020.01); *G01R 31/392* (2019.01); *H01M 10/443* (2013.01); *H02J 7/0047* (2013.01); *H02J 7/00714* (2020.01); *H02J 7/007182* (2020.01); *H02J 7/007194* (2020.01)

(58) Field of Classification Search
  CPC ...... H02J 7/00714; H02J 7/0047; H02J 7/005; H02J 7/007182; H02J 7/007194; G01R 31/392; H01M 10/443
  USPC .................................................. 320/133, 152
  See application file for complete search history.

(56) References Cited

U.S. PATENT DOCUMENTS

| | | | |
|---|---|---|---|
| 2005/0017687 A1* | 1/2005 | Nagaoka | H02J 7/0048 320/132 |
| 2006/0267553 A1* | 11/2006 | Chuang | H02J 5/00 320/128 |
| 2007/0182373 A1* | 8/2007 | Sakakibara | G01R 31/392 320/115 |
| 2008/0164849 A1* | 7/2008 | Ciaramitaro | H02J 7/0091 320/161 |
| 2011/0057603 A1 | 3/2011 | Marty et al. | |
| 2019/0033395 A1* | 1/2019 | Karner | G06Q 10/06315 |

(Continued)

FOREIGN PATENT DOCUMENTS

KR  20050027588 A  *  9/2003
KR  20150124447 A  *  3/2015

*Primary Examiner* — Richard Isla
*Assistant Examiner* — Manuel Hernandez
(74) *Attorney, Agent, or Firm* — Sterne, Kessler, Goldstein & Fox P.L.L.C.

(57) ABSTRACT

Methods and apparatuses are disclosed for adjusting a maximum charge amount of a battery. Batteries have preferred usage parameters, such as charging rates, maximum charge amounts, heat, etc. Throughout a battery's lifespan, it is used in different ways that are outside of these parameters. This slowly degrades the quality of the battery. According to the present disclosure, this usage is monitored and accounted for so as to increase the lifespan of the battery and prevent or reduce further degradation. Specifically, the usage is separated into bins, such as temperature and voltage bins. Each bin is associated with a different weighting factors. The amount of time the battery has spent in each bin is multiplied by the corresponding weighting factors, and these values are summed to provide an overall degradation value of the battery. Charging or other aspects of the battery are then controlled according to this degradation value.

19 Claims, 6 Drawing Sheets

(56) References Cited

U.S. PATENT DOCUMENTS

| | | | |
|---|---|---|---|
| 2019/0036178 A1* | 1/2019 | Karner | H02J 13/00002 |
| 2021/0083486 A1* | 3/2021 | Klicpera | H01M 10/443 |
| 2021/0313816 A1* | 10/2021 | Yamagami | H02J 7/0048 |
| 2023/0009288 A1* | 1/2023 | Kang | B60L 3/0046 |

* cited by examiner

METHOD AND APPARATUS FOR CHARGING A BATTERY BASED ON A WEAR FACTOR CALCULATED FROM USAGE STATISTICS AND USAGE PARAMETERS OF THE BATTERY

FIELD

Various embodiments generally may relate to the field of batteries, and battery charging.

SUMMARY

In an embodiment, a battery charging system is disclosed that includes a battery, a memory that stores usage statistics of the battery, and a controller. The controller is configured to receive usage statistics of the battery, receive usage parameters of the battery, calculate a wear factor based on the usage statistics and the usage parameters, and control a charging rate of the battery based on the calculated wear factor.

In embodiments, the controller is further configured to receive real-time usage information, and the real-time usage information is received from one or more sensors.

In embodiments, the one or more sensors include a current sensor.

In embodiments, the calculating includes: assigning voltage and temperature values of the received usage statistics to bins defined by the received usage parameters, each bin being associated with a corresponding scaling factor, determining an amount of time the battery has spent in each bin, and multiplying each time amount by the corresponding scaling factor to generate weighted contributions to wear for each of the bins.

In embodiments, the calculating further includes summing weighted contributions to wear to generate the wear factor.

In embodiments, the controller is further configured to: update the usage statistics of the battery based on the received real-time usage information, and store the updated usage statistics in the memory.

In embodiments, a current controller is disposed in a charging path of the battery configured to limit an amount of current received by the battery, and the controller is configured to control the charging rate of the battery by transmitting an instruction to the current controller.

In an embodiment, a method for calculating a battery charging limit is disclosed. The method comprises: receiving battery state parameters from a memory, the battery state parameters defining a plurality of voltage bins and a plurality of temperature bins, receiving battery usage statistics from the memory, the battery charging statistics including an amount of time the battery has spent in each of the voltage bins and each of the temperature bins, and calculating an accumulated battery degradation based on the received battery charging statistics and the received battery state parameters.

In embodiments, each of the plurality of voltage bins and the plurality of temperature bins includes a corresponding weighting factor.

In embodiments, the calculating includes, for each of the plurality of voltage bins and each of the plurality of temperature bins, multiplying the amount of time by the corresponding weighting factor to generate a plurality of weighted values.

In embodiments, the calculating further includes summing the plurality of weighted values to generate the accumulated battery degradation.

In embodiments, charging the battery based on the accumulated battery degradation.

In embodiments, the charging includes: charging the battery at maximum voltage in response to the accumulated battery degradation being below a first predetermined threshold, charging the battery at a first reduced voltage that is less than the maximum voltage in response to the accumulated battery degradation being above the first predetermined threshold and below a second predetermined threshold, and charging the battery at a second reduced voltage that is less than the first reduced voltage in response to the accumulated battery degradation being above the second predetermined threshold.

In an embodiment, a method for charging a battery is disclosed. The method comprises: measuring temperature levels and voltage levels of the battery over time, assigning the measured temperature levels and voltage levels to a number of corresponding temperature range bins and voltage range bins, tracking time amounts that the battery has spent operating in the temperature range bins and the voltage range bins, to determine usage statistics of the battery, calculating, based on the usage statistics, a wear factor of the battery, and controlling a charging aspect of the battery based on the calculated wear factor.

In embodiments, the charging aspect of the battery includes a charging rate of the battery.

In embodiments, the charging aspect of the battery includes a charging amount of the battery.

In embodiments, the method further comprises receiving real-time usage information of the battery from one or more sensors, the one or more sensors including a current sensor.

In embodiments, the method further comprises: updating the usage statistics based on the received real-time usage information; and storing the updated usage statistics in a memory.

In embodiments, each of the voltage range bins and each of the temperature range bins is associated with a weighting factor.

In embodiments, the calculating includes determining a wear contribution attributable to each bin by multiple the time amounts of each bin by the corresponding weighting factors.

DETAILED DESCRIPTION

In recent history, electronic devices have become more portable and more powerful. With these new capabilities, today's mobile and portable devices increasingly depend on the capabilities of their batteries. While battery technology has greatly improved, most batteries still suffer from the wear and tear of their user's charging and discharging habits. For example, most batteries having an ideal or preferred charging rate, charging level, and discharge level. But individual habits typically do not conform to those specifications. For example, a battery in a laptop computer may spend most time fully charged. Batteries that remain fully charged over long periods of time tend to wear out significantly faster than other batteries that fluctuate charge level, or those that are held at around 50% charge level. Batteries in other devices, such as cellular phones, may fluctuate between high levels of usage/heat, and full charge. In embodiments, this wear and tear can be monitored, and accounted for during charging/discharging of the battery, as discussed below.

Figure 1:
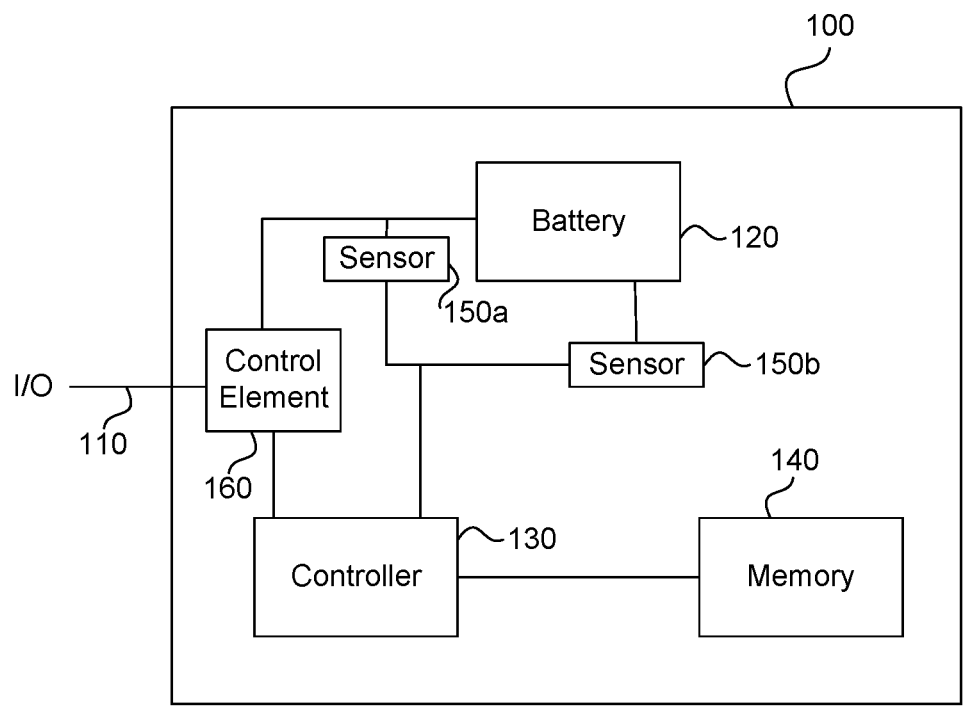
FIG. 1 illustrates a block diagram of an exemplary battery control system according to an embodiment.

FIG. 1 illustrates a block diagram of an exemplary battery control system 100 according to an embodiment. As shown in FIG. 1, a battery 120 charges and discharges via a input/output terminal 110. A memory 140 stores various information about the battery, including usage statistics and parameters. The usage parameters define various measurable aspects of the battery, such as temperature and charge level. In embodiments, the usage parameters can also define bins (e.g., ranges), with respect to each of the different aspects. For example, the temperature parameter may include three bins—a low temperature bin, a preferred temperature bin, and a high temperature bin, each having their own non-overlapping temperature ranges.

The usage statistics, on the other hand, indicate the usage of the battery with respect to the different usage parameters. In an embodiment, this is carried out by tracking an amount of time the battery has spent in each bin of the different usage parameters. In an embodiment, the usage statistics may also store a previously-calculated charging profile of the battery.

A controller 130 is also provided for tracking usage of the battery, updating the usage statistics stored in the memory 140, and implementing charge control of the battery based on the battery usage. For example, a plurality of sensors 150 monitor various usage parameters of the battery 120, and report them to the controller 130. For example, sensor 150a may be a current sensor configured to detect a charge/discharge rate of the battery 120. Meanwhile, sensor 150b may be a temperature sensor configured to detect an operating temperature of the battery, or a voltage sensor configured to detect a charge level of the battery. The sensors 150 send these real-time usage statistics of the battery 120 to the controller 130.

The controller 130 receives the real-time usage statistics from the sensors 150, and the usage statistics and usage parameters from the memory, and calculates a charge control profile for the battery. This calculation is described in further detail below. The controller 130 then implements the control profile by controlling one or more control elements 160. In an embodiment, the control element 160 is a current controller configured to reduce or stop an amount of charging current provided to the battery. In this manner, the controller 130 can implement one or both of a charge rate control (e.g., adjusting the rate at which the battery 120 charges) or a charge level control (e.g., adjusting a maximum charge voltage of the battery 120). In embodiments, the control element 160 may take other forms so as to allow for alternative or additional types of control.

Figure 2:
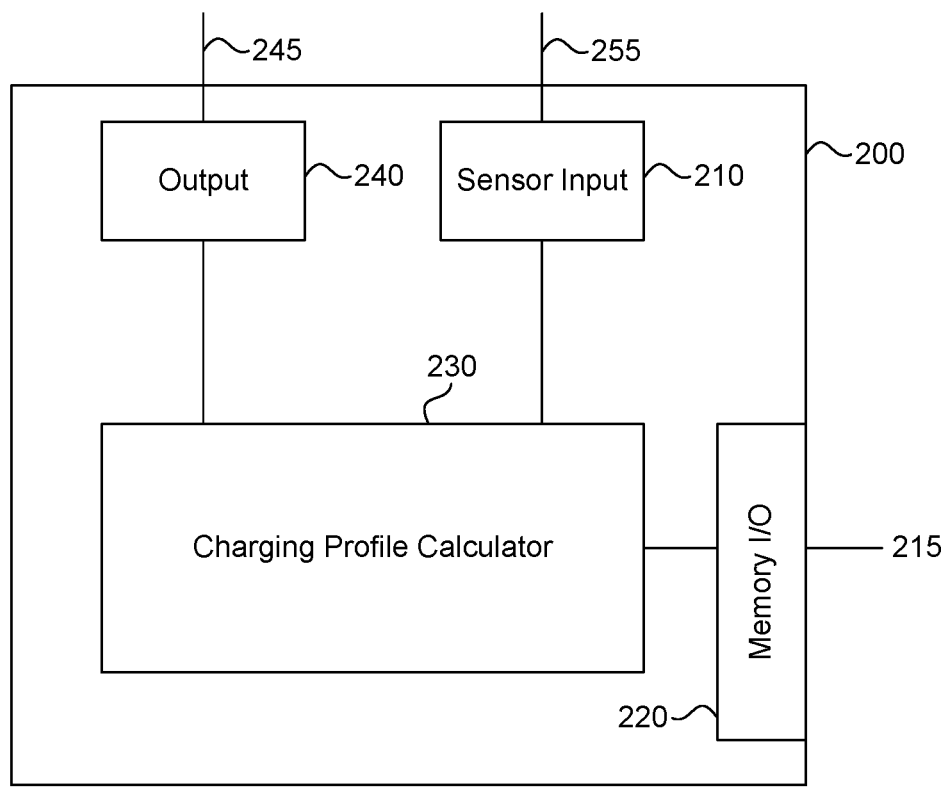
FIG. 2 illustrates a block diagram of an exemplary controller that may be used in the battery control system according to an embodiment.

FIG. 2 illustrates a block diagram of an exemplary controller 200 that may be used in the battery control system 100 according to an embodiment. As shown in FIG. 2, the controller 200 includes a charging profile calculator 230 that performs the charge control calculations. A memory I/O 220 receives the usage statistics and parameters from the memory via a communication line 215, and provides that information to the charging profile calculator 230. A sensor input 210 receives the real-time sensor measurements from the sensors 150 via sensor bus 205, and provides the sensor measurements to the charging profile calculator 230.

Based on the received usage statistics and parameters, and the received sensor measurements, the charging profile calculator 230 calculates the charge control to be applied to the battery. The charging profile calculator 230 then updates the usage statistics of the battery based on the received sensor measurements. In an embodiment, this includes modifying the received usage statistics based on the received sensor measurements, and storing the modified usage statistics in the memory 140 for later retrieval. In an embodiment, the charging profile calculator 230 compares a received sensor measurement to a corresponding usage statistic, and determines based on the comparison a modified value of the statistic. This can be performed by determining a difference between the sensor measurement and the usage statistic, as well as an amount of time the battery experiences the sensor measurement. In an embodiment, this constitutes a running average with regard to the usage statistic. The charging profile calculator 230 also outputs a charge control 245 via output 240 to the control element 160. In this manner, the controller 200 is able to lengthen the lifespan of the battery by controlling charge and/or discharge of the battery based on lifetime usage statistics.

Table 1, below, illustrates exemplary usage parameters of a battery. As shown, a battery's voltage parameter may be broken into three bins: VA, VB, and VC. In the example shown in FIG. 1, the VA bin corresponds to a high voltage state of the battery, the VB bin corresponds to a midrange voltage state of the battery, and VC corresponds to a low voltage state of the battery. Similarly, a temperature parameter is separated into five bins: UT, LT, ST, HT, and OT, with UT being an under-temperature, LT being a low-temperature, ST being a standard temperature, HT being a high temperature, and OT being an over-temperature. Each of these different bins is associated with a corresponding weighting factor $\omega$. As shown in the table below, a more extreme operating condition corresponds to a larger $\omega$ value. For example, the voltage bin VA has a higher weighting factor $\omega=4$ than voltage bin VB with weighting factor $\omega=3$. Likewise, for the various temperature bins and their respective weighting factors.

|  | Voltage Bins and acceleration factor | | | Temperature Bins and acceleration factor | | | | |
| --- | --- | --- | --- | --- | --- | --- | --- | --- |
|  | VA | VB | VC | UT | LT | ST | HT | OT |
|  | V > 4.32 | 4.32 > V > 4.30 | 4.30 > V > 4.27 | T < 12 | 15 > T > 12 | 25 > T > 15 | 35 > T > 25 | 45 > T > 35 |
| Weighting factor | 4 | 3 | 2 | 0.5 | 1 | 2 | 3 | 4 |

Over the course of the battery's life, the controller 200 will receive sensor measurements with respect to these parameters either in real-time or at regular intervals, and will track an amount of time the battery spends in each bin, for both voltage and temperature. In an embodiment, a plurality of scaling factors β are also defined corresponding to a combined weighting factor for time spent in a combined voltage/temperature bin. For example, for n voltage bins and m temperature bins, n*m scaling factors β would be calculated for each of the nm combined bins. In the above example, this results in 15 bins, with the high-voltage, high-temperature combined bin having a scaling factor of 16 (e.g., 4*4), and the low-voltage, low-temperature combined bin having a scaling factor of 1 (e.g., 0.5*2). These values are also stored in the memory and retrieved by the controller 200. Table 2, below, illustrates these scaling factors.

| Voltage Bin (weighting factor) | Temperature Bin (weighting factor) | Scaling Factor β |
|---|---|---|
| VA (4) | UT (0.5) | 2 |
| VA (4) | LT (1) | 4 |
| VA (4) | ST (2) | 8 |
| VA (4) | HT (3) | 12 |
| VA (4) | OT (4) | 16 |
| VB (3) | UT (0.5) | 1.5 |
| VB (3) | LT (1) | 3 |
| VB (3) | ST (2) | 6 |
| VB (3) | HT (3) | 9 |
| VB (3) | OT (4) | 12 |
| VC (2) | UT (0.5) | 1 |
| VC (2) | LT (1) | 2 |
| VC (2) | ST (2) | 4 |
| VC (2) | HT (3) | 6 |
| VC (2) | OT (4) | 8 |

The controller 200 examines, based on the usage statistics received from memory, an amount of time that battery has spent in each bin. In an embodiment, the controller 200 instead determines an amount of time that the battery has spent in each combined bin. The controller then calculates a degradation value $VT_t$ based on these times. In an embodiment, this is achieved by calculating a weighted degradation attributed to each bin-time, and then summing these weighted degradations. This can be represented by:

$$VT_t = \Sigma_n \text{Time}_{bin}(\text{Bin}_n) * \omega_n,$$

in the case of a single parameter calculation.
Similarly, the equation can be represented by:

$$VT_t = \Sigma_{n,m} \text{Time}_{cbin}(CBin_{nm}) * \beta_n,$$

in the case of a combined parameter calculation.
In other words, the above equations sum the weighted contributions to degradation. Table 3, below, illustrates these contributions.

| Voltage/ Temperature bins | scaling factor ($\beta_{n,m}$) | Weighted contribution ($\text{Time}_{cbin}(CBin_{nm})$ * $\beta_{n,m}$) |
|---|---|---|
| VA/UT | 2 | time in bin VA/UT * 2 |
| VA/LT | 4 | time in bin VA/LT * 4 |
| VA/ST | 8 | time in bin VA/ST * 8 |
| VA/HT | 12 | time in bin VA/HT * 12 |
| VA/OT | 16 | time in bin VA/OT * 16 |
| VB/UT | 1.5 | time in bin VB/UT * 1.5 |
| VB/LT | 3 | time in bin VB/LT * 3 |
| VB/ST | 6 | time in bin VB/ST * 6 |
| VB/HT | 9 | time in bin VB/HT * 9 |
| VB/OT | 12 | time in bin VB/OT * 12 |
| VC/UT | 1 | time in bin VC/UT * 1 |
| VC/LT | 2 | time in bin VC/LT * 2 |
| VC/ST | 4 | time in bin VC/ST * 4 |
| VC/HT | 6 | time in bin VC/HT * 6 |
| VC/OT | 8 | time in bin VC/OT * 8 |

The degradation value $VT_t$ that results from these equations is then used to control battery charge. Table 4, below, illustrates exemplary charge control according to the calculated degradation value $VT_t$.

| VTt charging Table | | |
|---|---|---|
| VTt | Charging Voltage | Charging voltage VA > VB > VC |
| VTt > A | VC | charge at lower tier than VB to reduce aging and swell |
| B < VTt < A | VB | charge at lower tier than VA to reduce aging and swell |
| VTt < C | VA | charge at max voltage |

As shown in Table 4, above, when the degradation value $VT_t$ is above a first predetermined threshold value A, the battery is determined to be highly degraded. Thus, the battery is charged to a low voltage (e.g., VC). Alternatively, if the degradation value $VT_t$ is determined to be below the first threshold A, but above a second threshold B, the battery is determined to be moderately degraded. Thus, the battery is charged to a middle voltage (e.g., VB). Lastly, if the degradation value $VT_t$ is determined to be below the second threshold B, the battery is determined to be in good condition, and thus the battery is charged at maximum voltage (e.g., VA). Although the above table describes control in terms of charge level, other charging characteristics could instead or additionally be controlled, such as charge rate, discharge rate, etc.

Figure 3:
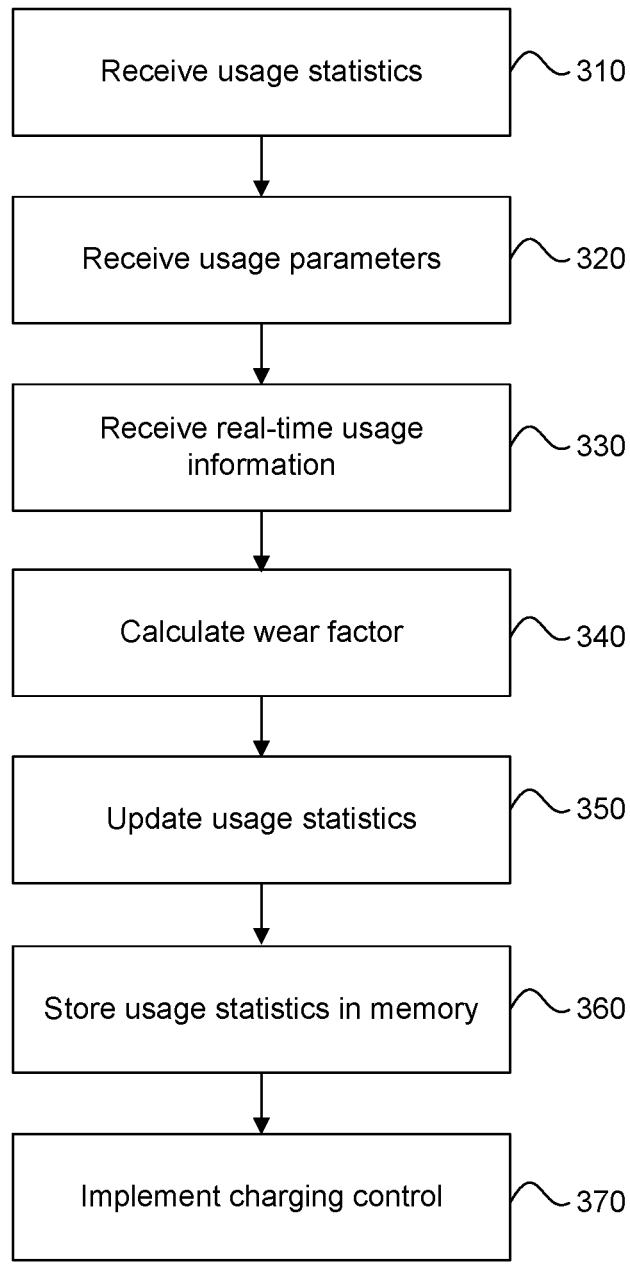
FIG. 3 illustrates a flowchart diagram of an exemplary method for charging a battery according to an embodiment.

FIG. 3 illustrates a flowchart diagram of an exemplary method 300 for charging a battery according to an embodiment. As shown in FIG. 3, a controller receives usage statistics (310) of a battery being monitored and controlled. The controller also receive usage parameters (320) of the battery. The controller also receives real-time (e.g., new) usage information (330) associated with the battery. In an embodiment, this usage information is received from one or more sensors.

Based on the received usage statistics, usage parameters, and real-time usage information, the controller calculates a wear (e.g., degradation) value (340) of the battery. The controller also updates the usage statistics (350) based on the received real-time usage information. The controller then stores the updated usage statistics (360) in a memory. Lastly, the controller implements a charging control (370) of the battery based on the calculated degradation value.

Figure 4:
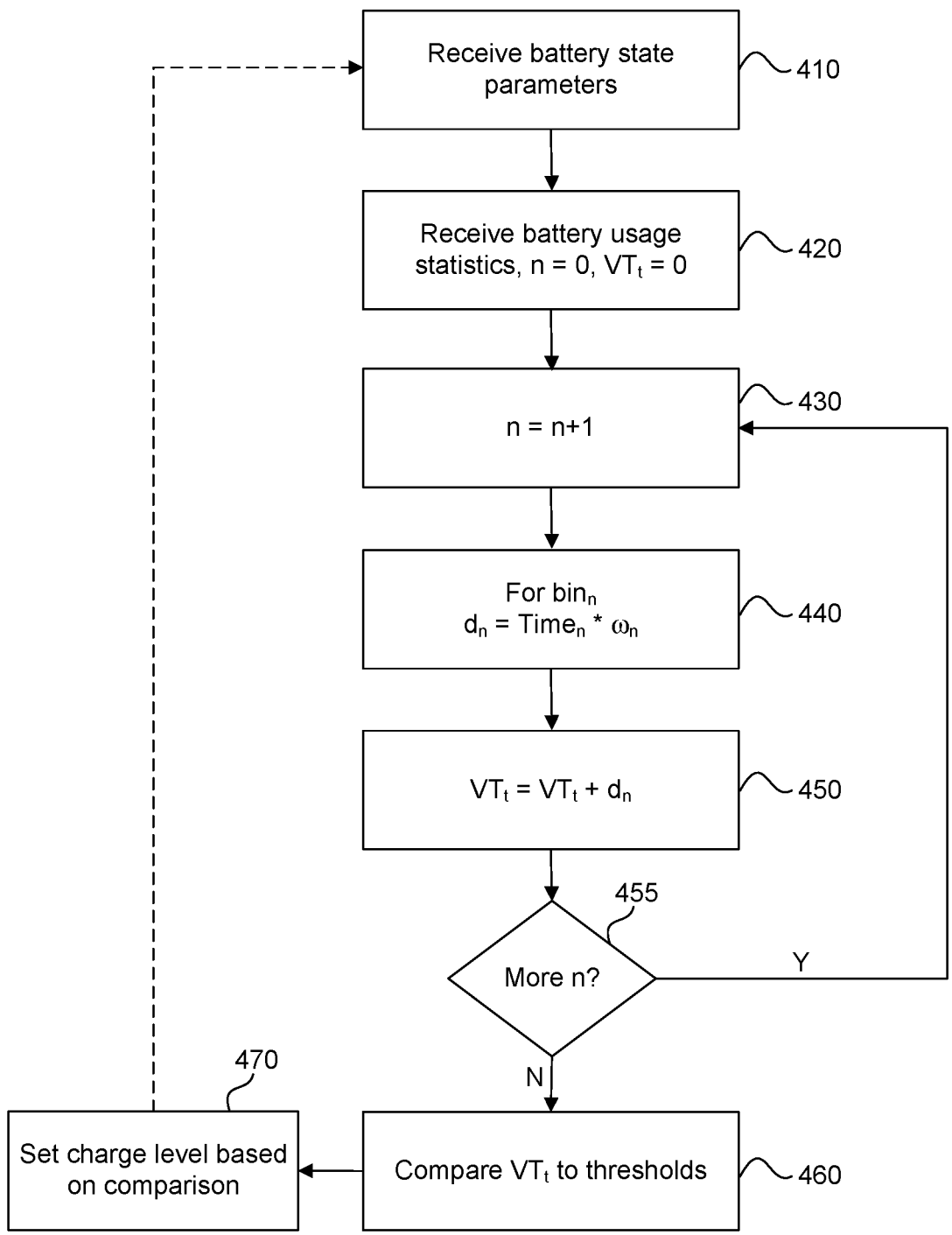
FIG. 4 illustrates a flowchart diagram of an exemplary method for calculating a charge amount according to an embodiment.

FIG. 4 illustrates a flowchart diagram of an exemplary method 400 for calculating a charge amount according to an embodiment. As shown in FIG. 4, the controller receives battery state parameters 410. In an embodiment, these state parameters correspond to the voltage and temperature parameters described above. Included within these parameters are the various bins. The controller also receives battery usage statistics (420) from the memory, and initializes a bin number n and a degradation value $VT_t$ to 0.

Once the relevant information has been obtained, the controller carries out an algorithm for calculating a degradation value of the battery. In this algorithm, the controller increments the value of n (430). Then, for the bin corresponding to n, the controller calculates (440) a degradation value $d_n$ as the product of the amount of time spent in the bin ($Time_n$) and the scaling factor $\omega_n$. The controller then adds (450) the degradation value $d_n$ to the previous value of $VT_t$, and sets this value to $VT_t$. The controller then determines whether there are any remaining bins (455). If there are (455—Y), then the controller repeats steps 430-455. This continues until there are no remaining bins (455—N). In this manner, the controller sums the degradation attributable to time spent in each defined bin. In an embodiment, this algorithm can be modified to traverse n and m for examining bins of two different usage parameters (e.g., voltage and temperature). The method can be further scaled for additional parameters.

Once the final degradation $VT_t$ is calculated, the controller compares the degradation value $VT_t$ (460) to one or more threshold values, as described above. Depending on how the degradation value $VT_t$ compares to those thresholds, the controller sets a charge level (470) of the battery. In an embodiment, these calculations occur repeatedly over the life of the battery.

Figure 5:
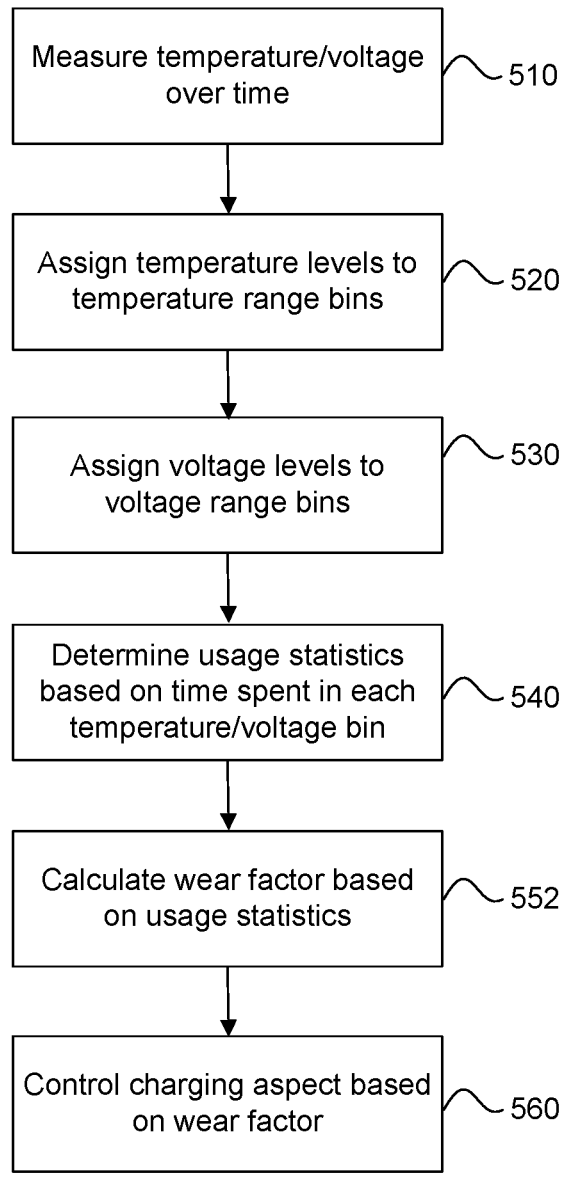
FIG. 5 illustrates a flowchart diagram of an exemplary method for charging a battery.

FIG. 5 illustrates a flowchart diagram of an exemplary method 500 for charging a battery. As shown in FIG. 5, the method begins by measuring the temperature and/or voltage of the battery over time (510). The temperature measurements are then assigned to temperature range bins (520). The voltage measurements are also assigned to different voltage range bins (530). As discussed above, these bins are based on the usage parameters of the battery and are each associated with a different weighting or scaling factor depending on the amount of wear being within that range causes to the battery.

Once the usage has been entered into bins, the method determines the amount of time, over the life of the battery to date, that the battery has spent in each of the different temperature and voltage bins (540). Based on these time amounts, and the scaling/weighting factor associated with each bin, the method calculates a wear factor attributable to each bin (550). Based on the calculated wear factor, the method controls a charging aspect of the battery (560).

Figure 6:
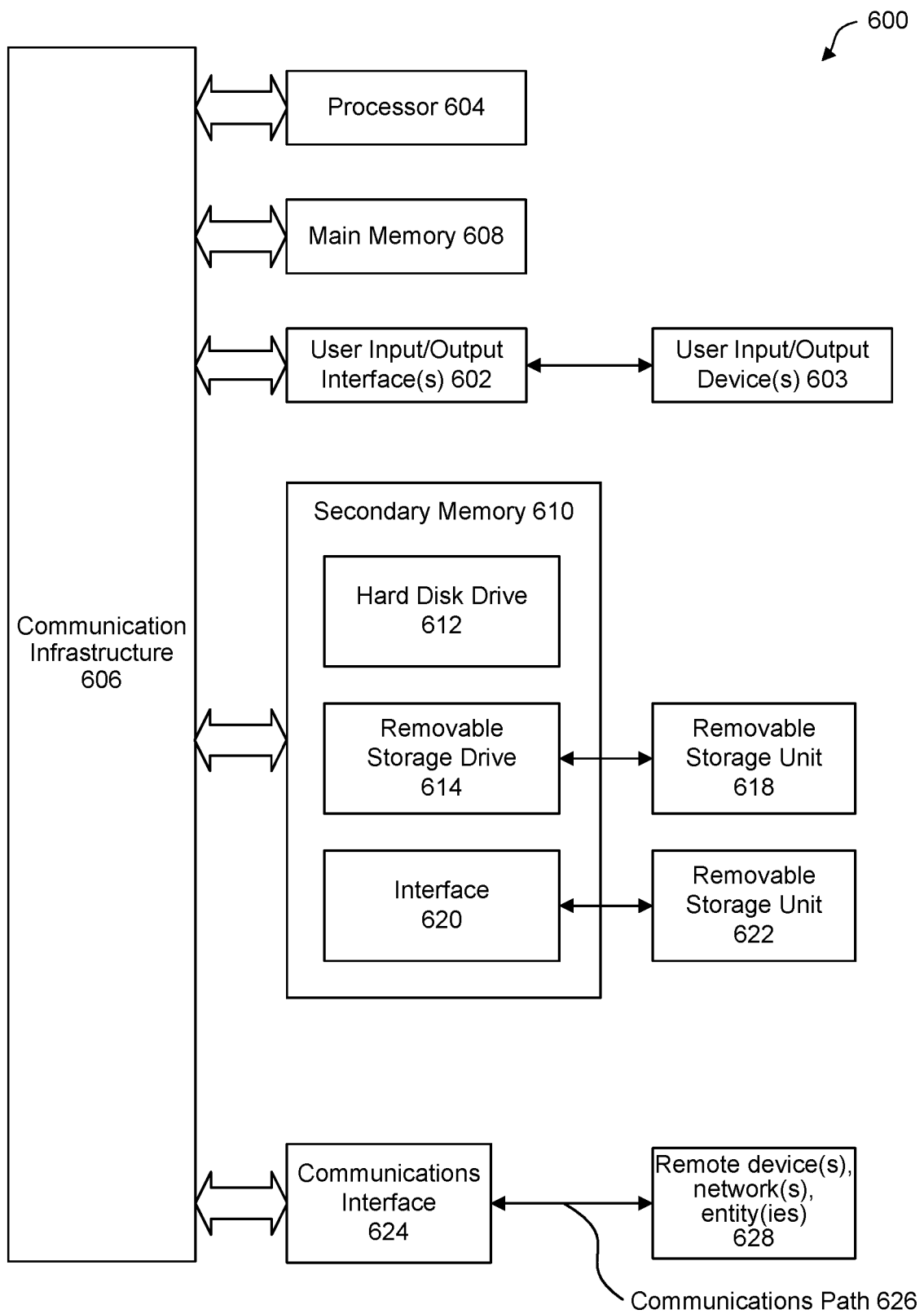
FIG. 6 illustrates a exemplary generic computer system capable of implementing certain aspects of the present disclosure.

Various embodiments can be implemented, for example, using one or more computer systems, such as computer system 600 shown in FIG. 6. Computer system 600 can be any well-known computer capable of performing the functions described herein such as those of controller 130 of FIG. 1. Computer system 600 includes one or more processors (also called central processing units, or CPUs), such as a processor 604. Processor 604 is connected to a communication infrastructure 606 (e.g., a bus.) Computer system 600 also includes user input/output device(s) 603, such as monitors, keyboards, pointing devices, etc., that communicate with communication infrastructure 606 through user input/output interface(s) 602. Computer system 600 also includes a main or primary memory 608, such as random access memory (RAM). Main memory 608 may include one or more levels of cache. Main memory 608 has stored therein control logic (e.g., computer software) and/or data.

Computer system 600 may also include one or more secondary storage devices or memory 610. Secondary memory 610 may include, for example, a hard disk drive 612 and/or a removable storage device or drive 614. Removable storage drive 614 may be a floppy disk drive, a magnetic tape drive, a compact disk drive, an optical storage device, tape backup device, and/or any other storage device/drive.

Removable storage drive 614 may interact with a removable storage unit 618. Removable storage unit 618 includes a computer usable or readable storage device having stored thereon computer software (control logic) and/or data. Removable storage unit 618 may be a floppy disk, magnetic tape, compact disk, DVD, optical storage disk, and/or any other computer data storage device. Removable storage drive 614 reads from and/or writes to removable storage unit 618 in a well-known manner.

According to some embodiments, secondary memory 610 may include other means, instrumentalities or other approaches for allowing computer programs and/or other instructions and/or data to be accessed by computer system 600. Such means, instrumentalities or other approaches may include, for example, a removable storage unit 622 and an interface 620. Examples of the removable storage unit 622 and the interface 620 may include a program cartridge and cartridge interface (such as that found in video game devices), a removable memory chip (such as an EPROM or PROM) and associated socket, a memory stick and USB port, a memory card and associated memory card slot, and/or any other removable storage unit and associated interface.

Computer system 600 may further include a communication or network interface 624. Communication interface 624 enables computer system 600 to communicate and interact with any combination of remote devices, remote networks, remote entities, etc. (individually and collectively referenced by reference number 628). For example, communication interface 624 may allow computer system 600 to communicate with remote devices 628 over communications path 626, which may be wired and/or wireless, and which may include any combination of LANs, WANs, the Internet, etc. Control logic and/or data may be transmitted to and from computer system 600 via communication path 626.

The operations in the preceding embodiments can be implemented in a wide variety of configurations and architectures. Therefore, some or all of the operations in the preceding embodiments may be performed in hardware, in software or both. In some embodiments, a tangible, non-transitory apparatus or article of manufacture includes a tangible, non-transitory computer useable or readable medium having control logic (software) stored thereon is also referred to herein as a computer program product or program storage device. This includes, but is not limited to, computer system 600, main memory 608, secondary memory 610 and removable storage units 618 and 622, as well as tangible articles of manufacture embodying any combination of the foregoing. Such control logic, when executed by one or more data processing devices (such as computer system 600), causes such data processing devices to operate as described herein.

Based on the teachings contained in this disclosure, it will be apparent to persons skilled in the relevant art(s) how to make and use embodiments of the disclosure using data processing devices, computer systems and/or computer architectures other than that shown in FIG. 6. In particular, embodiments may operate with software, hardware, and/or operating system implementations other than those described herein.

It is to be appreciated that the Detailed Description section, and not the Summary and Abstract sections, is intended to be used to interpret the claims. The Summary and Abstract sections may set forth one or more but not all exemplary embodiments of the present disclosure as contemplated by the inventor(s), and thus, are not intended to limit the present disclosure and the appended claims in any way.

The present disclosure has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present disclosure should not be limited by any of the above-described exemplary embodiments, but should be defined only in accordance with the following claims and their equivalents.

What is claimed is:

1. A method for charging a battery, comprising:
   measuring temperature levels and voltage levels of the battery over time;
   assigning the measured temperature levels and voltage levels to a number of corresponding temperature range bins and voltage range bins;
   tracking time amounts that the battery has spent operating in the corresponding temperature range bins and the corresponding voltage range bins, to determine usage statistics of the battery;
   calculating, based on the usage statistics, a wear factor of the battery; and
   controlling a charging aspect of the battery based on the calculated wear factor.

2. The method of claim 1, wherein the charging aspect of the battery includes a charging rate of the battery.

3. The method of claim 1, wherein the charging aspect of the battery includes a charging amount of the battery.

4. The method of claim 1, further comprising receiving real-time usage information of the battery from one or more sensors, the one or more sensors including a current sensor.

5. The method of claim 4, further comprising:
   updating the usage statistics based on the received real-time usage information; and
   storing the updated usage statistics in a memory.

6. The method of claim 1, wherein each of the corresponding temperature range bins and each of the corresponding voltage range bins is associated with a weighting factor.

7. The method of claim 6, wherein the calculating includes determining a wear contribution attributable to each bin by multiplying the time amounts of each bin by the corresponding weighting factors.

8. A battery charging system, comprising:
a battery;
a memory that stores usage statistics of the battery; and
a controller configured to:
   receive the usage statistics of the battery;
   receive usage parameters of the battery that define a measurable aspect of the battery and that characterize value ranges of the measurable aspect into different usage bins, the usage bins including voltage bins and temperature bins;
   calculate a wear factor based on the usage statistics and the usage parameters, including:
      assigning voltage and temperature values of the received usage statistics to the voltage bins and temperature bins, respectively, defined by the received usage parameters;
      determining an amount of time the battery has spent in each usage bin; and
      calculate the wear factor based on the amount of time the battery has spent in each usage bin; and
   control a charging rate of the battery based on the calculated wear factor.

9. The battery charging system of claim 8, wherein the controller is further configured to receive real-time usage information, and
wherein the real-time usage information is received from one or more sensors.

10. The battery charging system of claim 9, wherein the one or more sensors include a current sensor.

11. The battery charging system of claim 8, wherein each usage bin is associated with a corresponding scaling factor, and
wherein the calculating further includes
multiplying each time amount by the corresponding scaling factor to generate weighted contributions to wear for each of the usage bins.

12. The battery charging system of claim 11, wherein the calculating further includes summing weighted contributions to wear to generate the wear factor.

13. The battery charging system of claim 9, wherein the controller is further configured to:
update the usage statistics of the battery based on the received real-time usage information; and
store the updated usage statistics in the memory.

14. The battery charging system of claim 8, further comprising a current controller disposed in a charging path of the battery configured to limit an amount of current received by the battery,
wherein the controller is configured to control the charging rate of the battery by transmitting an instruction to the current controller.

15. A method for calculating a battery charging limit, comprising:
receiving battery state parameters from a memory, the battery state parameters defining a plurality of voltage bins and a plurality of temperature bins;
receiving battery usage statistics from the memory, the battery usage statistics including an amount of time a battery has spent in each of the plurality of voltage bins and each of the plurality of temperature bins;
calculating an accumulated battery degradation based on the received battery usage statistics and the received battery state parameters;
calculating the battery charging limit based on the accumulated battery degradation; and
charging the battery based on the accumulated battery degradation.

16. The method of claim 15, wherein each of the plurality of voltage bins and the plurality of temperature bins includes a corresponding weighting factor.

17. The method of claim 16, wherein the calculating includes, for each of the plurality of voltage bins and each of the plurality of temperature bins, multiplying the amount of time by the corresponding weighting factor to generate a plurality of weighted values.

18. The method of claim 17, wherein the calculating further includes summing the plurality of weighted values to generate the accumulated battery degradation.

19. The method of claim 15, wherein the charging includes:
- charging the battery at maximum voltage in response to the accumulated battery degradation being below a first predetermined threshold;
- charging the battery at a first reduced voltage that is less than the maximum voltage in response to the accumulated battery degradation being above the first predetermined threshold and below a second predetermined threshold; and
- charging the battery at a second reduced voltage that is less than the first reduced voltage in response to the accumulated battery degradation being above the second predetermined threshold.

* * * * *